(12) United States Patent
Ishihara et al.

(10) Patent No.: US 8,866,131 B2
(45) Date of Patent: Oct. 21, 2014

(54) ORGANIC LIGHT-EMITTING DEVICE AND LIGHT SOURCE APPARATUS USING SAME

(75) Inventors: Shingo Ishihara, Mito (JP); Hiroshi Sasaki, Mito (JP); Akitoyo Konno, Hitachi (JP)

(73) Assignee: Hitachi, Ltd., Tokyo (JP)

( * ) Notice: Subject to any disclaimer, the term of this patent is extended or adjusted under 35 U.S.C. 154(b) by 204 days.

(21) Appl. No.: 13/639,066

(22) PCT Filed: Apr. 2, 2010

(86) PCT No.: PCT/JP2010/002420
§ 371 (c)(1),
(2), (4) Date: Oct. 2, 2012

(87) PCT Pub. No.: WO2011/125090
PCT Pub. Date: Oct. 13, 2011

(65) Prior Publication Data
US 2013/0056717 A1    Mar. 7, 2013

(51) Int. Cl.
*H01L 35/24*    (2006.01)
(52) U.S. Cl.
USPC .................................. 257/40; 257/E51.001
(58) Field of Classification Search
USPC ........................................ 257/40, E51.001
See application file for complete search history.

(56) References Cited

U.S. PATENT DOCUMENTS

| | | | |
|---|---|---|---|
| 5,891,554 | A | 4/1999 | Hosokawa et al. |
| 6,124,024 | A | 9/2000 | Hosokawa et al. |
| 2005/0007000 | A1 | 1/2005 | Chou et al. |
| 2007/0086180 | A1 | 4/2007 | Sotoyama |

FOREIGN PATENT DOCUMENTS

| | | | |
|---|---|---|---|
| JP | 07-240277 A | | 9/1995 |
| JP | 2846571 B2 | | 10/1998 |
| JP | 2005-150043 A | | 6/2005 |
| JP | 2006-278494 A | | 10/2006 |
| JP | 2006-278549 A | | 10/2006 |
| JP | 2007-035432 A | | 2/2007 |
| WO | 02/37568 A1 | | 5/2002 |
| WO | 02/37580 A1 | | 5/2002 |

*Primary Examiner* — Anthony Ho
(74) *Attorney, Agent, or Firm* — Volpe and Koenig, P.C.

(57) ABSTRACT

An organic light-emitting device including a first substrate, a second substrate, a light drawing-out layer disposed between the first substrate and the second substrate, a transparent electrode disposed between the light drawing-out layer and the first substrate, a reflection electrode disposed between the transparent electrode and the first substrate, and a first light-emitting unit disposed between the transparent electrode and the reflection electrode. The first light-emitting unit includes a first light-emitting layer that emits a first light-emitting color. In the organic light-emitting device, relations of the equation $L_1 \geq \lambda_2/4$ and the equation $L_1 \cos\theta_1 = \lambda_1 (1/4+n/2)$ are satisfied, wherein $L_1$ is an optical length from a light-emitting point in the first light-emitting layer to the reflection electrode, $\lambda_2$ is a wavelength at the longer wavelength side, having an intensity of 1% of the maximum intensity of a light-emitting spectrum of the first light-emitting color, $\lambda_1$ is a wavelength at the shorter wavelength side, having an intensity of 1% of the maximum intensity of the light-emitting spectrum of the first light-emitting color, n is an integer not less than 0, and $0 < \theta_1 \leq 60$.

11 Claims, 3 Drawing Sheets

ORGANIC LIGHT-EMITTING DEVICE AND LIGHT SOURCE APPARATUS USING SAME

TECHNICAL FIELD

The present invention concerns an organic light-emitting device and a light source apparatus using the same.

BACKGROUND ART

As an existent example, a patent literature 1 discloses the following technique. It is an object to provide an organic electroluminescence device (organic EL device) of a simple configuration with the color purity of the blue-light emission being particularly increased, in which (1) a total optical thickness of a transparent electrode of a large refractivity and an organic multi-layer part in the construction of a substrate/a transparent electrode of a large refractivity/an organic multi-layer part/a cathode, (2) a total optical thickness of an underlayer of a large refractivity, a transparent electrode, and an organic multi-layer part or a total optical thickness of a transparent electrode and an organic multi-layer part in the construction of a substrate/an underlayer of a large refractivity/a transparent electrode/an organic multi-layer part/a cathode, or (3) a total optical thickness of a transparent electrode and an organic multi-layer part in the construction of a substrate/a underlayer of a low refractivity/a transparent electrode/an organic multi-layer part/a cathode is set at so as to enhance the intensity of the center wave length λ (λ is selected from 440 to 490 nm, 500 to 550 nm, and 600 to 650 nm) of the EL light emitted from the organic multi-layer part having a refractive index of 1.6 to 1.8.

DOCUMENTS ON PRIOR ARTS

Patent Document

Patent Literature 1: Japanese Patent Publication No. 2846571

DISCLOSURE OF THE INVENTION

Problems to be Solved by the Invention

In an organic light-emitting element having a light drawing-out layer, it is difficult to improve an external quantum efficiency under a light interference condition in the conventional technique. The object of the present invention is to improve the external quantum efficiency in an organic light-emitting device using an organic light-emitting element and a light source apparatus using the same.

Means for Solving the Problem

The present invention has the following aspects to achieve the object described above.

(1) An organic light-emitting device comprising a first substrate; a second substrate; a light drawing-out layer disposed between the first substrate and the second substrate; a transparent electrode disposed between the light drawing-out layer and the first substrate; a reflection electrode disposed between the transparent electrode and the first substrate; and a first light-emitting unit disposed between the transparent electrode and the reflection electrode; wherein the light drawing-out layer includes particles and a binder; wherein the particles have larger refractive index than the transparent electrode has; wherein the first light-emitting unit includes a first light-emitting layer for emitting a first light-emitting color; and wherein relations of equation (1) and equation (2) are satisfied:

$$L_1 \geq \lambda_2/4 \quad (1)$$

$$L_1 \cos\theta_1 = \lambda_1(\tfrac{1}{4}+n/2) \quad (2)$$

where $L_1$ is an optical length from a first light-emitting point in the first light-emitting layer to the reflection electrode, where $\lambda_2$ is a wavelength at the longer wavelength side, having an intensity of 1% of the maximum intensity of a light-emitting spectrum of the first light-emitting color, where $\lambda_1$ is a wavelength at the shorter wavelength side, having an intensity of 1% of the maximum intensity of the light-emitting spectrum of the first light-emitting color, where n is an integer not less than 0, and where $0<\theta_1\leq 60$.

(2) The organic light-emitting device according to the organic light-emitting device (1) described above, wherein the first light-emitting unit further includes a second light-emitting layer for emitting a second light-emitting color, and wherein relations of equation (3) and equation (4) are satisfied instead of the equation (1) and the equation (2), respectively:

$$L_2 \geq \lambda_4/4 \quad (3)$$

$$L_1 \cos\theta_2 = \lambda_3(\tfrac{1}{4}+n/2) \quad (4)$$

where $L_2$ is a shorter optical length when comparing an optical length from the first light-emitting point in the first light-emitting layer to the reflection electrode and an optical length from a second light-emitting point in the second light-emitting layer to the reflection electrode, where $\lambda_4$ is a longer wavelength when comparing a wavelength at the longer wavelength side, having an intensity of 1% of the maximum intensity of the light-emitting spectrum of the first light-emitting color and a wavelength at the longer wavelength side, having an intensity of 1% of the maximum intensity of a light-emitting spectrum of the second light-emitting color, where $\lambda_3$ is a shorter wavelength when comparing the wavelength at the shorter wavelength side, having an intensity of 1% of the maximum intensity of the light-emitting spectrum of the first light-emitting color and the wavelength at the shorter wavelength side, having an intensity of 1% of the maximum intensity of the light-emitting spectrum of the second light-emitting color, where n is an integer not less than 0, and where $0<\theta_2\leq 60$.

(3) The organic light-emitting device according to the organic light-emitting device (2) described above, wherein the first light-emitting unit further includes a third light-emitting layer for emitting a third light-emitting color, wherein a relation of equation (5) is satisfied instead of the equations (1) and (3), and wherein a relation of equation (6) is satisfied instead of the equations (2) and (4):

$$L_3 \geq \lambda_6/4 \quad (5)$$

$$L_3 \cos\theta_3 = \lambda_5(\tfrac{1}{4}+n/2) \quad (6)$$

where $L_3$ is a shortest optical length when comparing an optical length from the first light-emitting point in the first light-emitting layer to the reflection electrode, an optical length from the second light-emitting point in the second light-emitting layer to the reflection electrode, and an optical length from a third light-emitting point in the third light-emitting layer to the reflection electrode, where $\lambda_6$ is a longest wavelength when comparing a wavelength at the longer wavelength side, having an intensity of 1% of the maximum intensity of the light-emitting spectrum of the first light-emitting color, a wavelength at the longer wavelength side, having an intensity of 1% of the maximum intensity of the light-emitting spectrum of the second light-emitting color, and a wavelength at the longer wavelength side, having an intensity of 1% of the maximum intensity of the light-emitting spectrum of the third light-emitting color, where $\lambda_5$ is a shortest wavelength when comparing a wavelength at the shorter wavelength side, having an intensity of 1% of the maximum intensity of the light-emitting spectrum of the first light-emitting color, a wavelength at the shorter wavelength side, having an intensity of 1% of the maximum intensity on the light-emitting spectrum of the second light-emitting color, and a wavelength at the shorter wavelength side, having an intensity of 1% of the maximum intensity of the light-emitting spectrum of the third light-emitting color, where n is an integer not less than 0, and where $0 < \theta_3 \leq 60$.

(4) The organic light-emitting device according to the organic light-emitting device (1) described above, further comprising a second light-emitting unit disposed between the transparent electrode and the reflection electrode; and a charge generating layer disposed between the first light-emitting unit and the second light-emitting unit; wherein the second light-emitting unit includes a second light-emitting layer for emitting a second light-emitting color, and wherein relations of equation (7) and equation (8) are satisfied:

$$L_4 \geq \lambda_8/4 \tag{7}$$

$$L_4 \cos \theta_4 = \lambda_7(\tfrac{1}{4}+n/2) \tag{8}$$

where $L_4$ is an optical length from a light-emitting point in the second light-emitting layer to the reflection electrode, where $\lambda_8$ is a wavelength at the longer wavelength side, having an intensity of 1% of the maximum intensity of a light-emitting spectrum of the second light-emitting color, where $\lambda_7$ is a wavelength at the shorter wavelength side, having an intensity of 1% of the maximum intensity of the light-emitting spectrum of the second light-emitting color, where n is an integer not less than 0, and where $0 < \theta_4 \leq 60$.

(5) The organic light-emitting device according to the organic light-emitting device (4) described above, wherein the second light-emitting unit further includes a third light-emitting layer for emitting a third light-emitting color, and wherein relations of equation (9) and equation (10) are satisfied instead of the equation (7) and the equation (8), respectively:

$$L_{p1} \geq \lambda_{p2}/4 \tag{9}$$

$$L_{p1} \cos \theta_{p1} = \lambda_{p1}(\tfrac{1}{4}+n/2) \tag{10}$$

where $L_{p1}$ is a shorter wavelength when comparing an optical length from the second light-emitting point in the second light-emitting layer to the reflection electrode and an optical length from a third light-emitting point in the third light-emitting layer to the reflection electrode, where $\lambda_{p2}$ is a longer wavelength when comparing a wavelength at the longer wavelength side, having an intensity of 1% of the maximum intensity of the light-emitting spectrum of the second light-emitting color and a wavelength at the longer wavelength side, having an intensity of 1% of the maximum intensity of the light-emitting spectrum of the third light-emitting color, where $\lambda_{p1}$ is a shorter wavelength when comparing a wavelength at the shorter wavelength side, having an intensity of 1% of the maximum intensity of the light-emitting spectrum of the second light-emitting color and a wavelength at the shorter wavelength side, having an intensity of 1% of the maximum intensity of the light-emitting spectrum of the third light-emitting color, where n is an integer not less than 0, and where $0 < \theta_{p1} \leq 60$.

(6) The organic light-emitting device according to the organic light-emitting device (3) described above, wherein the first light-emitting color is blue, the second light-emitting color is green, the third light-emitting color is red, and the first light-emitting layer, the second light-emitting layer, and the third light-emitting layer are disposed in this order from the reflection electrode to the transparent electrode.

(7) The organic light-emitting device according to the organic light-emitting device (5) described above, wherein the first light-emitting color is blue, and one of the second light-emitting color and the third light-emitting color is red and the other of them is green.

(8) The organic light-emitting device according to the organic light-emitting device (1) described above, wherein the first light-emitting unit includes a second light-emitting layer for emitting a second light-emitting color, and wherein relations of equation (11) and equation (12) are satisfied:

$$L_5 \geq \lambda_{10}/4 \tag{11}$$

$$L_5 \cos \theta_5 = \lambda_9(\tfrac{1}{4}+n/2) \tag{12}$$

where $L_5$ is an optical length from the second light-emitting point in the second light-emitting layer to the reflection electrode, where $\lambda_{10}$ is a wavelength at the longer wavelength side, having an intensity of 1% of the maximum intensity of the light-emitting spectrum of the second light-emitting color, where $\lambda_9$ is a wavelength at the shorter wavelength side, having an intensity of 1% of the maximum intensity of the light-emitting spectrum of the second light-emitting color, where n is an integer not less than 0, and where $0 < \theta_5 \leq 60$.

(9) The organic light-emitting device according to the organic light-emitting device (1) described above, wherein the light drawing-out layer is bonded to the second substrate by an adhesive layer.

(10) The organic light-emitting device according to the organic light-emitting device (1) described above, wherein the first light-emitting unit further includes a hole transport layer, an electron transport layer, a buffer layer, a hole injection layer, and an electron injection layer.

(11) A light source apparatus comprising the organic light-emitting device (1) described above and a driving device.

Advantageous Effects of the Invention

According to the present invention, an external quantum efficiency of an organic light-emitting element and a light source apparatus using the same can be improved. Other subjects, constitution, and the effect than those described above will be apparent in the following description of preferred embodiments.

DESCRIPTION OF EMBODIMENTS

Figure 1:
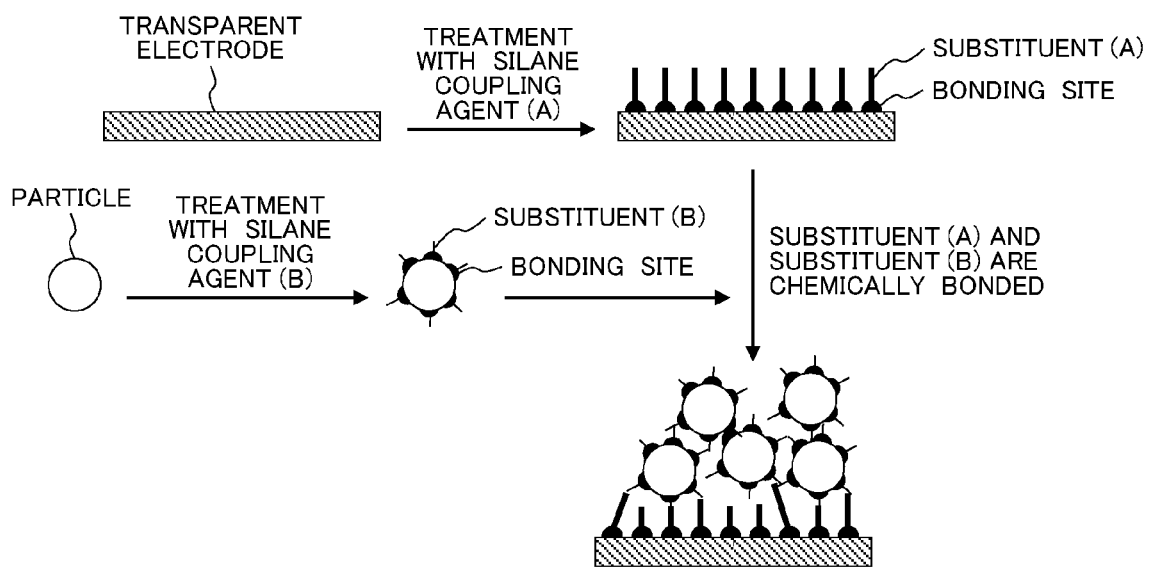
FIG. 1 shows an example of a process for modifying a particle surface of a particle layer used in an organic light-emitting element according to the present invention.

Embodiments of the present invention are to be described with reference to the drawings.

An organic light-emitting device is expected, for example, as a flat illumination device and an illumination device of a liquid crystal display apparatus, and has a plurality of organic light-emitting elements that form pixels on a substrate. The organic light-emitting element has an upper electrode, a lower electrode, and an organic layer put between the lower electrode and the upper electrode. The organic layer has a hole transport layer for transporting holes, an electron transport layer for transporting electrons, and a light-emitting layer in which the holes and electrons are re-combined. By applying a voltage between the lower electrode and the upper electrode, the holes and the electrons injected from the lower electrode and the upper electrode are re-combined in the light-emitting layer to emit light.

One of the electrodes of the lower electrode and the upper electrode of the organic light-emitting element has a reflection function. In this embodiment, the upper electrode is a transparent electrode through which an emitted light transmits and the lower electrode is a reflection electrode. Light emitted from the light-emitting layer is emitted from the organic light-emitting element to an air layer by way of the following three principal optical paths. The first optical path includes light-emitting layer→transmission through upper electrode→air layer, the second optical path includes light-emitting layer→reflection at lower electrode→transmission through upper electrode→air layer, and the third optical path includes: light-emitting layer→upper electrode (reflection at substrate/upper electrode interface)→reflection at lower electrode→transmission through upper electrode→air layer. The light through the optical paths and the light further put to multi-reflection in the optical paths cause light interference. Therefore, it is necessary that the layers that form the organic light-emitting element satisfy optimal light interference conditions.

It is defined in the conventional technique that the total optical length including the organic layer that forms the organic light-emitting element and the transparent electrode is a multiple integer of one-half of the center emission wavelength or that the value of the total optical length with addition of ¼ center emission wavelength is an integer multiple of one-half of the center emission wavelength. The optical length is defined by a value as a product of a refractive index and a thickness of a material forming an organic layer or a transparent electrode.

The refractive index of the organic layer ranges about from 1.5 or more and 1.9 or less, the refractive index of the transparent electrode is about 2.0, and the refractive index of the glass substrate is about 1.5. Accordingly, angle of total reflection is present at the interface between the air layer and the glass substrate, the interface between the glass substrate and the transparent electrode, etc. till the light is emitted to the air layer. Therefore, light at an angle larger than the angle of total reflection causes total reflection and cannot be drew out finally to the air layer, which results in lowering of the efficiency. The physical amount representing the light-emitting efficiency of an organic light-emitting element includes an external quantum efficiency. The external quantum efficiency is defined as the number of photons drew out to the air layer based on the number of injected electrons (holes). Further, the external quantum efficiency is defined also by a value as a product of an internal quantum efficiency and a light drawing-out efficiency. Due to the effect of the total reflection at the interface described above, the light drawing-out efficiency is about 20%.

As a method of improving the external quantum efficiency, the following structure may be considered. In the organic light-emitting element, the lower electrode is used as a reflection electrode and the upper electrode is used as a transparent electrode and light is drew out on the side of the upper electrode. Since the refractive index of the upper transparent electrode is about 2.0 and the refractive index of the air layer is 1.0, an angle of total reflection is present at the interface between the transparent electrode and the air layer. Therefore, a light drawing-out layer is disposed between the upper transparent electrode and the air layer.

In the present invention, the light drawing-out layer is formed by the following two methods. One of them is a method of mixing particles and a binder and then forming them as a light drawing-out layer and another of them is a method of forming layer only with particles and then filling the binder therein.

Each of them is to be described.

(1) A method of mixing the particles and the binder and forming them as a light drawing-out layer At first, for enhancing the dispersibility of the particles to a solvent and suppressing agglomeration between the particles to each other after coating, the surface of the particles are chemically modified by a silane coupling agent, or a dispersing agent is added to the particles. The particles are dispersed together with a binder material into an organic solvent. Thus, a light drawing-out layer-forming coating material is prepared. The coating material is coated on the upper transparent electrode (IZO or ITO substrate) and the binder material is cured to form a light drawing-out layer.

The materials used in this method are to be described below.

(1-1) Particles (A) Kind of Particles

It is necessary that the refractive index of the particles that form the light drawing-out layer is larger than the refractive index of the transparent electrode. Since the transparent electrode includes ITO or IZO, the refractive index is about 2.0. For emitting the light, it is necessary that the refractive index of the particles is larger than the refractive index of the transparent electrode. Then, particles having a refractive index of 2.0 or more are selected. In the case of illumination, those of white or pale color in a visible region are desired so that emitted light is not colored. Specifically, they include titanium oxide (refractive index: 2.5 to 2.7), zirconium oxide (refractive index: 2.4), barium titanate (refractive index: 2.4), strontium titanate (refractive index: 2.37) bismuth oxide (refractive index: 2.45), etc. Further, when a desired light-emitting color is colored such as in the case of traffic lights (green, yellow, and red) or warning lights (red), particles of a color similar to the color thereof can be used. It is possible to use blue particles such as of copper oxide (refractive index: 2.71), etc. in a case of emitting a blue light, red particles such as of ferric oxide (refractive index: 3.01) etc., in a case of emitting a red color, and yellow particles such as of cadmium oxide (refractive index: 2.49), etc. in a case of emitting a yellow light.

For the particles, a less denaturing inorganic oxide is preferred. Further, a silica sol is more preferred as a binder material since the silica sol shows high bonding performance with the oxide.

(B) Size of Particles

The average diameter of particles is preferably 0.5 µm or more and 10 µm or less. More preferably, the average diameter of particles is 0.8 µm or more and 5.0 µm or less.

(C) Specific Gravity of Particles

Particles of large refractive index also have large specific gravity. For example, the specific gravity of zirconium oxide is 6.1, the specific gravity of titanium oxide is 4.1 or more and 4.2 or less, and the specific gravity of barium titanate is as large as 6.1. Accordingly, the surfaces of the particles are chemically modified by a silane coupling agent to enhance the dispersibility in a solvent.

(D) Chemical Modification of Particle Surfaces

At first, a silane coupling agent is added to an organic solvent, to which particles are added and stirred for several hours. After evaporating the solvent by an evaporator, the particles are heated at 120° C. for 30 minutes. Thus, the silane coupling agent is bonded by silicon-oxygen bond to the surface of the particles.

When the addition amount of the silane coupling agent used is excessively large, particles tend to be agglomerated after coating to the substrate. Then, agglomeration of the particles can be suppressed by previously measuring the surface area of particles, for example, by a BET method and using the silane coupling agent in a minimal amount necessary for coating the surface area.

The silane coupling agent includes, for example, those having alkoxy silane groups bonded by the number of 2 or 3 and chloro groups bonded by the number of 2 or 3 to a silicon atom. Other silicon substituents than the alkoxysilane and chloro group, those of the following structures are suitable to the dispersion of the particles.

[Compound Group A]

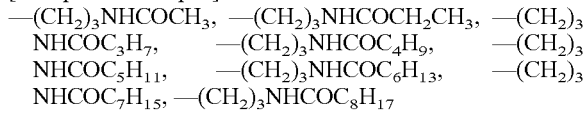
—(CH$_2$)$_3$NHCOCH$_3$, —(CH$_2$)$_3$NHCOCH$_2$CH$_3$, —(CH$_2$)$_3$NHCOC$_3$H$_7$, —(CH$_2$)$_3$NHCOC$_4$H$_9$, —(CH$_2$)$_3$NHCOC$_5$H$_{11}$, —(CH$_2$)$_3$NHCOC$_6$H$_{13}$, —(CH$_2$)$_3$NHCOC$_7$H$_{15}$, —(CH$_2$)$_3$NHCOC$_8$H$_{17}$ They are prepared by previously bonding a silane coupling agent having a —(CH$_2$)$_3$NH$_2$ group to the surfaces of particles and then reacting a corresponding carboxylic acid to the amino group.

[Compound Group B]

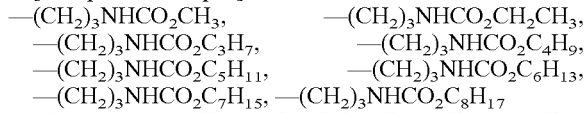
—(CH$_2$)$_3$NHCO$_2$CH$_3$, —(CH$_2$)$_3$NHCO$_2$CH$_2$CH$_3$, —(CH$_2$)$_3$NHCO$_2$C$_3$H$_7$, —(CH$_2$)$_3$NHCO$_2$C$_4$H$_9$, —(CH$_2$)$_3$NHCO$_2$C$_5$H$_{11}$, —(CH$_2$)$_3$NHCO$_2$C$_6$H$_{13}$, —(CH$_2$)$_3$NHCO$_2$C$_7$H$_{15}$, —(CH$_2$)$_3$NHCO$_2$C$_8$H$_{17}$ They are prepared by previously bonding a silane coupling agent having a —(CH$_2$)$_3$NCO group to the surfaces of particles and then reacting a corresponding alcohol to the isocyanate group.

In addition, silane coupling agents having, for example, isocyanate group, vinyl group, 3-glycidoxy propyl group, and 3-chloropropyl group are suitable to the dispersion of the particles.

Hydrocarbon type substituents, for example, —C$_6$H$_{13}$, —C$_8$H$_{17}$, —C$_{10}$H$_{21}$, or aromatic ring substituents, for example, —C$_6$H$_5$, —C$_{10}$H$_7$, etc. can improve the dispersibility to the solvent. However, the substituents described above have no good dispersibility when they are formed as a film but tend to form agglomeration of the particles. The dispersibility tends to be improved when they are formed as the film by using a silane coupling agent having a bonding site having a hetero atom, for example, an amide coupling in the substituent.

(1-2) Binder Material

Since the particles are an inorganic material, an epoxy resin having close bondability with an inorganic material is suitable as the binder material. As other organic materials than those described above, acrylic resin, polycarbonate resin cycloolefinic resin, etc. are highly transparent and suitable.

(2) Method of Forming a Layer Only with Particles and then Filling a Binder

Particles chemically modified at the surface are chemically bonded to the surface of a transparent electrode chemically modified at the surface. Then, a resin is filled between the particles under a reduced pressure to fill voids between the particles.

An example is to be described below, in which chemically modified particles at the surface are chemically bonded to the surface of a transparent electrode having a chemically modified surface. FIG. 1 shows the outline thereof.

The surface of the transparent electrode is treated with a silane coupling agent (A). This silane coupling agent has a substituent A. Further, the particles are treated with a silane coupling agent (B). This silane coupling agent has a substituent B. Substitutes which can be chemically bonded to each other are selected as the substitutes A and B.

Then, the particles treated with the silane coupling agent are reacted with the surface of the transparent electrode to form chemical bonds between the transparent electrode surface and the particles. Particles not bonded to the surface of the transparent electrode are indirectly kept over the surface of the transparent electrode by forming a bonding of the alkoxy silane groups with the particles bonded to the surface of the transparent electrode.

When the amino group is selected for A, a silane coupling agent having a glycidyl group is selected for B, for example. It may be changed such that A is the glycidyl group and B is the amino group. Further, a chloro group may be selected instead of the glycidyl group. A substituent having a double bond such as a vinyl group may be selected both for A and B. In this case, a single bond can be formed by reacting the double bonds to each other and, at the same time, the particles and the surface of the transparent electrode can be bonded.

Figure 2:
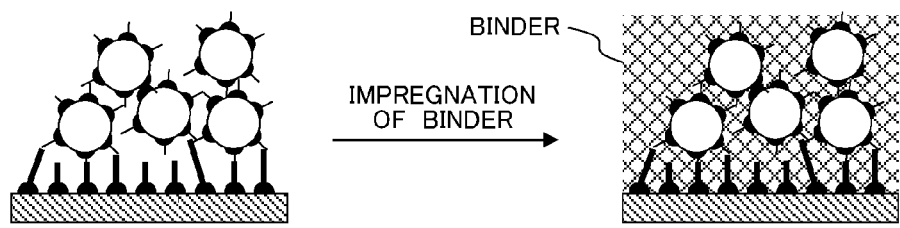
FIG. 2 shows another example of a process for modifying a particle surface of a particle layer used in an organic light-emitting element according to the present invention.

Then, as shown in FIG. 2, a resin is filled among the particles. A resin of low elasticity is impregnated under a reduced pressure. A light drawing-out layer is formed by the procedures described above.

Materials used for the method described above are as follows.

(2-1) Particles

Particles identical with the particles used in the method (1) described above are used.

(2-2) Binder

In view of easy impregnation into voids between fine particles of large refractive index, a resin of low elasticity is preferred as the binder. Actually, the surface of the transparent electrode includes undulation, etc. and is not always flat. Therefore, if the binder is not deformed at all, the bondability also lowers. Then, for increasing the close bondability to the surface of the transparent electrode, a storage modulus of the binder resin is lowered. Thus, when a pressure is applied from the surface of the transparent electrode, the binder deforms, bubbles scarcely intrude between the transparent electrode and the binder, and the transparent electrode and the fine particles can be bonded closely.

Specifically, the storage modulus is preferably 100 K Pascal or lower. When the storage modulus binder is 100 K Pascal or lower, the particles and the binder, and the transparent electrode can be bonded closely even if undulation of several µm is present on the surface of the transparent electrode. However, when the storage modulus is lowered excessively, the particles may possibly slide down from the transparent electrode. Accordingly, the modulus elasticity should be 1 K Pascal or more. Further, since the lower limit of the working temperature in a room is about 10° C., the storage modulus may be 1 k Pascal or more at that temperature.

As described above, the particles and the transparent electrode can be closely bonded by the binder when the binder has the storage modulus of 1 k Pascal or more and 100 k Pascal or less at 10° C.

Further, the light drawing-out efficiency can be made larger as the refractive index of the binder is larger. Then, the monomer for the binder includes the materials shown below. The binder is formed by adding a curing agent that optically or thermally promotes cure to the materials shown below and curing them.

At first, acrylic type material includes, for example, methyl methacrylate, ethyl methacrylate, propyl methacrylate, isopropyl methacrylate, butyl methacrylate, isobutyl methacrylate, hexyl methacrylate, octyl methacrylate, 2-ethylhexyl methacrylate, decyl methacrylate, dodecyl methacrylate, methyl acrylate, ethyl acrylate, propyl acrylate, isopropyl acrylate, butyl acrylate, isobutyl acrylate, hexyl acrylate, octyl acrylate, 2-ethylhexyl acrylate, decyl acrylate and dodecyl acrylate. Further, the material includes, for example, ethylene glycol, propylene glycol, diethylene glycol, 1, 3-dihydroxy cyclobutane, 1, 4-dihydroxy cyclohexane, and 1,5-dihydroxy cyclooctane having a plurality of hydroxyl groups in the molecule. Further, the material also includes ethylene glycol monoglycidyl ether, ethylene glycol diglycidyl ether, etc. having a glycidyl group at terminal end. Further, the material includes monomers having cyclic portions such as cycloalkane ring, aromatic ring, and norbornene ring in the side chain, a monomer having bisphenol A-like skeleton, etc.

They are used as a binder by using the acrylic resin alone or using also plural kinds of other resins together. They can be used as the binder also by copolymerizing them with other polymer. The polymer to be used includes polyacrylic acid, polyvinyl alcohol, and polyallyl amine. Further, shrinkage upon curing can be decreased by dissolving a polymerizate in a monomer to be used, the polymerizate including an acrylic resin and a urethane resin which are already polymerized and have no reaction sites with the monomer.

For lowering the storage modulus, materials having Tg equal to or lower than a room temperature are used specifically. This is because the elasticity of the resin is lowered when Tg is equal to a room temperature or lower. Tg of the acrylic monomer lowers as the number of carbon atoms of the alkyl group on the side chain increases. For lowering Tg to the room temperature or lower or providing sufficient flexibility and low elasticity, the number of carbon atoms in the side chain of the acrylic monomer is preferably about 4 or more.

For suppressing lowering of the elasticity of the resin, the average molecular weight of the resin is preferably smaller. For decreasing the average molecular weight, the addition ratio of a catalyst used upon curing is increased. Further, when optical curing is utilized as a method of curing the monomer, the average molecular weight of a resin to be formed can be decreased by lowering the intensity of radiation light. In thermal curing, a reaction initiator capable of curing at a temperature as low as possible is used, and curing is performed at a temperature as low as possible. This can decrease the average molecular weight of the resin to be formed.

At the interface between the upper transparent electrode and the light drawing-out layer, total reflection is decreased. Further, since light is scattered by fine particles in the light drawing-out layer, the light drawing-out efficiency is improved. As a result, an external quantum efficiency is improved. A detailed structure of an organic light-emitting element having a light drawing-out layer is shown in the following embodiments.

In the organic light-emitting element having the light drawing-out layer, reflection is reduced at the interface between the upper transparent electrode and the light drawing-out layer and at the interface between the light drawing-out layer and an air layer. Accordingly, in the organic light-emitting element having the light drawing-out layer, the light interference condition in the conventional technique does not provide an optimal condition. That is, the light interference condition for light along a first optical path of light-emitting layer→transmission through upper electrode→air layer (not air layer but sealing substrate in a case where the light drawing-out layer is formed on the side of the sealing substrate and the adhesive layer is filled between the light drawing-out layer and the sealing substrate) and for light along a second optical path of: light-emitting layer→reflection at lower reflection electrode→transmission through upper electrode→air layer maybe optimized. The light interference condition in the organic light-emitting element having the light drawing-out layer is to be investigated while taking the above matter into consideration.

At first, a light-emitting point of the light-emitting layer is defined. The light-emitting point of the light-emitting layer is an interface between the lower reflection electrode and other organic layer (generally, hole transport layer or electron transport layer) adjacent to the lower reflection electrode. The difference from the usual light-emitting point is to be described with reference to the embodiments. An optical length from the light-emitting point to the lower reflection electrode is defined as $L_1$. Then, in the fluorescence spectrum of the light-emitting layer that contributes to most of light emission of the organic light-emitting element, the center wavelength having the maximum emission intensity is defined as $\lambda_0$. A wavelength at the longer wavelength side from $\lambda_0$ having an intensity of 1% of the maximum intensity is defined as $\lambda_2$. The wavelength at the shorter wavelength side from $\lambda_0$ having an intensity of 1% of the maximum intensity is defined as $\lambda_1$.

The difference between the first optical path and the second optical path is $2L_1 \cos \theta$ in a direction slanted by $\theta°$ from the normal direction at the interface between the lower reflection electrode and other organic layer. For example, light at a wavelength $\lambda$ of $2L_1 \cos \theta = \lambda/2$ provides a positive interference condition, that is, a constructive condition. In this case, it is assumed that the phase of light changes by $\lambda/2$ radian in the lower reflection electrode. The optical path difference $2L_1 \cos \theta$ is a value as a product of the optical path difference $2L_1$ in the normal direction and $\cos \theta$. Accordingly, the wavelength constructive in the direction $\theta°$ is shorter than the wavelength constructive in the normal direction. Therefore, when the wavelength of the constructive light interference condition in the normal direction is made longer than $\lambda_2$, a direction constructing $\lambda_0$ and $\lambda_1$ is present in an oblique direction. On the other hand, when $\theta$ is 60° or more in the lower reflection electrode, the reflectance lowers. Accordingly, the external quantum efficiency is improved by setting the angle for the constructive interference condition for $\lambda_0$ and $\lambda_1$ to 60° or less. That is, the external quantum efficiency can be improved by satisfying the following equations. Since it is assumed that the fluorescence spectrum is in the form of a Gaussian function, the area of the spectrum is 0.01% in the longer wavelength region than $\lambda_2$ that does not satisfy the interference condition of the following equation (1) and equation (2), which is not an inhibitive factor for the improving the external quantum efficiency. On the other hand, when the wavelength having an intensity of 5% of the maximum intensity is assumed as $\lambda_2'$ and $\lambda_1'$, the spectrum area of the wavelength region exceeding $\lambda_2'$ not satisfying the interference condition is about 4%, and the external quantum efficiency is lowered by about 4% compared with $\lambda_2$ and $\lambda_1$. However, the optical length $L_1$, that is, the thickness of the organic layer or the transparent electrode can be decreased compared with the case of using $\lambda_2$ and $\lambda_1$.

$$L_1 \geq \lambda_2/4 \quad (1)$$

$$L_1 \cos\theta = \lambda_1(1/4+n/2)$$

(n is an integer not less than 0, $0<\theta\leq 60$) (2)

Further, when a light-emitting unit includes a plurality of light-emitting layers, it is considered as described below. At first, it is assumed that the light-emitting unit includes a first light-emitting layer having a first light-emitting color and a second light-emitting layer having a second light-emitting color different in the color from the first light-emitting color. The external quantum efficiency can be improved by satisfying the equation (1) and the equation (2) for each of the first light-emitting layer and the second light emission. However, the external quantum efficiency can be improved also in a case of considering the interference condition as described below.

When the optical length from a first light-emitting point in the first light-emitting layer to the lower reflection electrode and the optical length from a second light-emitting point in the second light-emitting layer to the lower reflection electrode are compared, a shorter optical length is defined as $L_2$.

Then, when comparing the wavelength at the longer wavelength side having an intensity of 1% of the maximum intensity of the emission spectrum of the first light-emitting color and the wavelength at the longer wavelength side having an intensity of 1% of the maximum intensity of the emission spectrum of the second light-emitting color, a longer wavelength is defined as $\lambda_4$. Further, when comparing the wavelength at the shorter wavelength side having an intensity of 1% of the maximum intensity of the emission spectrum of the first light-emitting color and the wavelength at the shorter wavelength side having an intensity of 1% of the maximum intensity of the emission spectrum of the second light-emitting color, a shorter wavelength is defined as $\lambda_3$.

The external quantum efficiency can be improved by satisfying the following equations in the same manner as in the case of the equation (1) and the equation (2).

$$L_2 \geq \lambda_4/4 \quad (3)$$

$$L_2 \cos\theta = \lambda_3(1/4+n/2)$$

(n is an integer not less than 0, $0<\theta\leq 60$) (4)

In this case, the thickness of the organic light-emitting device can be decreased more in a case of considering the equation (3) and the equation (4) than in a case of considering the equation (1) and the equation (2) for the first light-emitting layer and the second light-emitting layer, respectively.

The content of the present invention is to be described more specifically with reference to concrete embodiments. The following embodiments show concrete embodiments for the content of the present invention. However, the present invention is not restricted to the embodiments and various changes and modifications are possible by persons in the skilled in the art within a range of the technical idea disclosed in the present specification.

Embodiment 1

Figure 3:
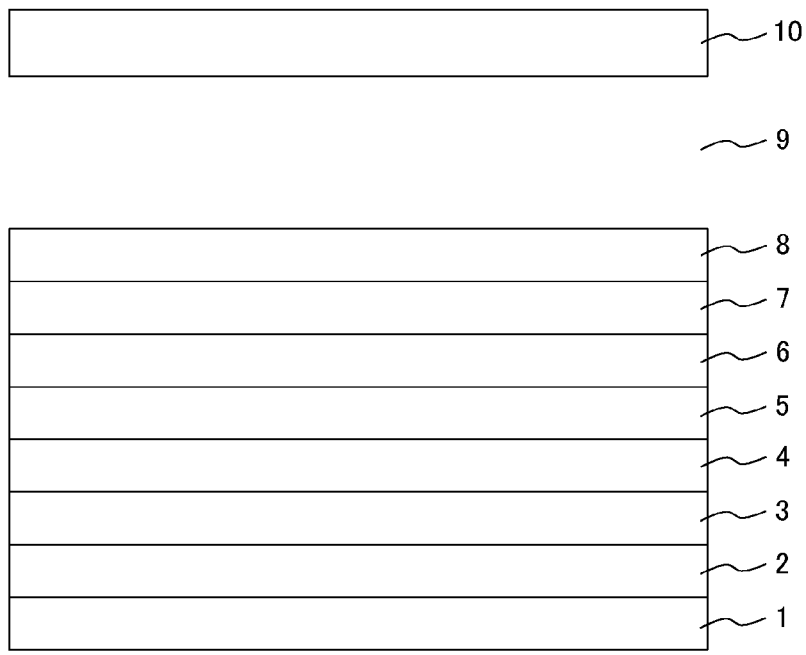
FIG. 3 is a cross sectional view of an organic light-emitting device according to an embodiment of the present invention.

An organic light-emitting device according to Embodiment 1 is to be described. FIG. 3 is a cross sectional view of an organic light-emitting device according to Embodiment 1. The organic light-emitting device has a substrate 1 as a first substrate and an organic light-emitting element disposed over the substrate 1. The organic light-emitting element has a lower reflection electrode 2 as an anode, a hole transport layer 3, a green-light emitting layer 4, an electron transport layer 5, a buffer layer 6, an upper transparent electrode 7 as a cathode, and a light drawing-out layer 8. However, the buffer layer 6 may be omitted as the organic light-emitting element. The lower reflection electrode 2 may be a cathode and the upper transparent electrode 7 may be an anode. The light drawing-out layer 8 is disposed between a sealing substrate 10 and the substrate 1. The upper transparent electrode 7 is disposed between the light drawing-out layer 8 and the substrate 1. The lower reflection electrode 2 is disposed between the upper transparent electrode 7 and the substrate 1. A first light-emitting unit is disposed between the upper transparent electrode 7 and the lower reflection electrode 2. An air layer 9 is present between the sealing substrate 10 and the light drawing-out layer 8. The light-emitting unit includes the hole transport layer 3, the green-light emitting layer 4, the electron transport layer 5 and the buffer layer 6. However, the buffer layer 6 may be omitted as the light emitting unit. Further, the light emitting unit can include a hole injection layer or an electron injection layer to be described later. A light source apparatus is obtained by providing a driving device, etc. to the organic light-emitting device in FIG. 3.

Over the organic light-emitting element, the sealing substrate 10 as a second substrate is disposed across the air layer 9. The sealing substrate 10 suppresses $H_2O$ and $O_2$ in the air from intruding into the inside of the organic light-emitting element. The sealing substrate 10 and the substrate 1 include, for example, a glass substrate and a plastic substrate made from an inorganic material such as $SiO_2$, $SiN_x$ or $Al_2O_3$. Examples of specific materials for the plastic substrate include polychloropyrene, polyethylene terephthalate, polyoxymethylene, polyvinyl chloride, polyvinylidene fluoride, cyanoethyl pullulan, polymethyl methacrylate, polysulfone, polycarbonate, and polyimide.

The lower reflection electrode 2 including an Al film of 150 nm thickness was formed over the substrate 1. The Al film was used as the lower reflection electrode 2 in this embodiment, but this is not restricted. For example, the material includes, for example, metals such as indium, molybdenum, and nickel, and alloys thereof, and inorganic materials such as polysilicon and amorphous silicon. Further, the material includes a stack film in which a transparent conductive film such as of tin oxide, indium oxide, indium-tin oxide (ITO), indium-zinc oxide (IZO), etc. is formed over the metal or the alloy described above.

Then, a vapor deposition film of 4,4-bis[N-(1-naphthyl)-N-phenylamino]biphenyl (hereinafter referred to as α-NPD) of 59 nm thickness was formed over the lower reflection electrode 2 by a vacuum vapor deposition method. The vapor deposition film functions as a hole transport layer 3.

In this embodiment, the vapor deposition film of α-NPD was used as the hole transport layer 3, but this is not restrictive. The hole transport layer 3 transports holes and injects them into the green-light emitting layer 4. Accordingly, it is preferred that the hole transport layer 3 includes a hole transporting material of large hole mobility. Further, it is preferred that the hole transport layer 3 is chemically stable, has low ionization potential, small electron affinity, and high glass transition temperature. Examples of the hole transport layer 3 preferably includes N,N'-bis (3-methylphenyl)-N,N'-diphenyl-[1,1'-biphenyl]-4,4,'diamine (TPD), 4,4'-bis [N-(1-naphthyl)-N-phenolamino]biphenyl (α-NPD), 4,4',4"-tri (N-carbazolyl) triphenylamine (TCTA), 1,3,5-tris [N-(4-diphenylaminophenyl) phenylamino]benzene (p-DPA-TDAB), 4,4',4"-tris(N-carbazole)triphenylamine (TCTA), 1,3,5-tris[N,N-bis(2-methylphenyl)-amino]-benzene (o-MTDAB), 1,3,5-tris[N,N-bis(3-methylphenyl)-amino]-benzene (m-MTDAB), 1,3,5-tris[N,N-bis(4-methylphenyl)-amino]-benzene (p-MTDAB), 4,4',4"-tris[1-naphthyl(phenyl)amino]triphenylamine (1-TNATA), 4,4',4"-tris[2-naphthyl(phenyl)amino]triphenylamine (2-TNATA), 4,4',4"-tris[biphenyl-4-yl-(3-methylphenyl)amino]triphenylamine (p-PMTDATA), 4,4',4"-tris[9,9-dimethylfluorene-2-yl(phenyl)amino]triphenylamine (TFATA), 4,4',4"-tris(N-carbazoyl) triphenylamine (TCTA), 1,3,5-tris-[N-(4-diphenylaminophenyl)phenylamino]benzene (p-DPA-TDAB), 1,3,5-tris-(4-methylphenyl(phenyl)amino]phenyl]benzene (MTDAPB), N,N'-di(biphenyl-4-yl)-N,N'-diphenyl[1,1'-biphenyl]4,4'-di amine (p-BPD), N,N'-bis(9,9-dimethylfluorene-2-yl)-N,N'-diphenylfluorene-2,7-diamine (PFFA), N,N,N',N'-tetrakis(9,9-dimethylfluorene-2-yl)-[1,1-bipheny 1]-4,4'-diamine (FFD), (NDA)PP, and 4-4'-bis[N,N'-(3-tolyl) amino]-3,3'-dimethylbiphenyl (HMTPD). One or more of these materials may be used for the hole transport layer 3.

If necessary, a hole injection layer may be disposed between the lower reflection electrode 2 and the hole transport layer 3. For lowering the injection barrier between the lower reflection electrode 2 and the hole transport layer 3, it is desired that the hole injection layer is formed of a material having an appropriate ionization potential. Further, the hole injection layer preferably has a role of leveling the unevenness on the surface of a layer as an underlayer for the hole injection layer. The hole injection layer includes, for example, copper phthalocyanine, starburstamine compound, polyaniline, polythiophene, vanadium oxide, molybdenum oxide, ruthenium oxide, and aluminum oxide.

Further, an oxidizing agent may be contained in the hole transporting material. This can lower the barrier between the lower reflection electrode 2 and the hole transport layer 3, or improve the electroconductivity. Examples of the oxidizing agent includes Lewis acid compounds such as ferric II chloride, ammonium chloride, gallium chloride, indium chloride and antimony pentachloride, electron accepting compounds such as trinitrofluorene, and the hole injection material such as vanadium oxide, molybdenum oxide, ruthenium oxide and aluminum oxide. One or more of these materials may be used for the oxidizing agent.

Then, a film prepared by co-vapor deposition of CBP and an iridium complex (hereinafter referred to as Ir (ppy)$_3$) of 30 nm thickness was formed by a vacuum vapor deposition method. The vapor deposition rates of CBP and Ir (ppy)$_3$ were set to 0.20 nm/sec and 0.02 nm/sec, respectively. Ir (ppy)$_3$ functions as a dopant that determines a light-emitting color. The co-vapor deposition film of CBP and Ir (ppy)$_3$ functions as a green-light emitting layer 4 emitting a green light at a center wavelength of 520 nm.

In the green-light emitting layer 4, injected holes and electrons are re-combined into an excited state to emit light at a wavelength inherent to the material. There are a case where the host material per se forming the green-light emitting layer 4 emits light and a case where a dopant material added by a trace amount to the host emits light. Examples of the host material includes distyrylarylene derivatives (DPVBi), silole derivatives having a benzene ring on the skeleton (2PSP), oxodiazole derivatives having a triphenylamine structure on both ends (EM2), perinone derivatives having phenanthrene group (P1), origothiophene derivatives having triphenylamine structure on both ends (BMA-3T), perylene derivatives (tBu-PTC), tris (8-quinolinole) aluminum, polyparaphenylene vinylene derivatives, polythiophene derivatives, polyparaphenylene derivatives, polysilane derivatives, and polyacetylene derivative. One or more of these materials may be used for the host material.

Then, Examples of the dopant material includes quinacridone, cumarine 6, nile red, ruburene, 4-(dicyanomethylene)-2-methyl-6-(para-dimethylaminostyryl)-4H-pyrane (DCM), dicarbazole derivatives, porphyrin platinum complexes (PtOEP), and iridium complexes (Ir(ppy)'$_3$). One or more of these materials may be used for the dopant material.

Then, a film formed by depositing tris(8-quinolinole) aluminum (hereinafter referred to as Alq$_3$) of 10 nm thickness by a vapor deposition method was formed over the green-light emitting layer 4. The vapor deposition film functions as the electron transport layer 5.

The electron transport layer 5 transports electrons and injects them into the green-light emitting layer 4. Accordingly, the electron transport layer 5 preferably includes an electron transporting material of large electron mobility. For example, tris(8-quinolinole) aluminum, oxadiazole derivatives, silole derivatives, zinc benzothiazole complex, and bathocuroine (BCP) are preferred as the electron transport layer 5. One or more of these materials may be used for the electron transport layer 5.

For the electron transport layer 5, it is preferred to contain a reducing agent in the electron transporting material described above to lower the barrier between the buffer layer 6 and the electron transport layer 5 or to improve the electroconductivity of the electron transport layer 5. The examples of the reducing agent includes alkali metals, alkaline earth metals, alkali metal oxides, alkaline earth oxides, rare earth oxides, alkali metal halides, alkaline earth halides, rare earth halides, and complexes formed of alkali metals, aromatic compounds, etc. Particularly preferred alkali metals are Cs, Li, Na, and K. The materials are not restrictive and one or more of these materials may be used for the reducing agent.

Then, a film of Mg and Ag in admixture was formed as the buffer layer 6 over the electron transport layer 5. In this case, the vapor deposition rates for Mg and Ag were set to 0.14 nm/s and 0.01 nm/s, respectively, by using a binary co-vacuum vapor deposition method, and a film of 10 nm thickness was vapor deposited.

Further, an electron injection efficiency may be improved by inserting an electron injection layer between the upper transparent electrode 7 or the buffer layer 6 and the electron transport layer 5. For example, lithium fluoride, magnesium fluoride, calcium fluoride, strontium fluoride, barium fluoride, magnesium oxide, and aluminum oxide are preferred as the electron injection layer. The materials are not restrictive and one or more of these materials may be used for the electron injection layer.

Then, an IZO film of 50 nm thickness was formed over the buffer layer 6 by a sputtering method. The IZO film functions as the upper transparent electrode 7. The IZO film is an amorphous oxide film. As the target in this step, a target satisfying In/(In+Zn)=0.83 is used. As the film deposition condition, an Ar:O$_2$ gas mixture was used as an atmosphere and the vacuum degree was set to 0.2 Pa and sputtering power was set to 2 W/cm$^2$. The transmittance of the Mg:Ag/In—Zn—O stack film was 65%.

The light drawing-out layer 8 was formed over the upper transparent electrode 7 by the method (1) described above. The binder is an epoxy resin. Particles dispersed in the binder included titanium oxide having an average particle diameter of 1 μm. The thickness of the light drawing-out layer was 5 μm. Thus, an organic light-emitting element is formed.

Then, the substrate 1 having the organic light-emitting element formed thereon was transferred without being exposed to the air into a sealing chamber in which a high purity nitrogen gas was circulated to keep a high dew point.

Then, a glass substrate was introduced into a sealing chamber. The glass substrate forms the sealing substrate 10. A photo-curable resin was drawn at the edge portion of the sealing substrate 10 by using a conventional seal dispenser device (not illustrated). The sealing substrate 10 and the substrate 11 were bonded to each other and press-bonded in the sealing chamber. A conventional light shielding plate was placed to the outside of the sealing substrate 10 such that a UV light is not applied to the entire organic light-emitting element, and the UV light is applied on the side of the sealing substrate 10 to cure the photocurable resin.

As described above, the organic light-emitting device of this embodiment was obtained. As described above, the organic light-emitting element emits green light in the green-light emitting layer 4. Specifically, a light-emitting distribution is formed such that the emission intensity is at the maximum at the interface between the green-light emitting layer 4 and the hole transport layer 3, and the light-emitting intensity is weakened as receding from the interface between the green-light emitting layer 4 and the hole transport layer 3 in the green-light emitting layer 4. The light-emitting region is about 10 nm. The light-emitting distribution is determined depending on the magnitude relation of the hole mobility and the electron mobility in the green-light emitting layer 4 and the magnitude relation of the injection barrier of the holes and the injection barrier of the electrons to the green-light emitting layer 4. The hole mobility and the electron mobility in the green-light emitting layer 4 of this embodiment are about $10^{-9}$ cm$^2$/Vs and about $10^{-3}$ cm$^2$/Vs respectively. Further, the hole injection barrier from the hole transport layer 3 to the green-light emitting layer 4 is 0.9 eV and the electron injection barrier from the electron transport layer 5 to the green-light emitting layer 4 is 0.3 eV. Accordingly, since the holes injected into the green-light emitting layer 4 are localized near the interface between the hole transport layer 3 and the green-light emitting layer 4, the light-emitting distribution described above is provided. It is difficult to determine the light-emitting distribution for various materials. Therefore, the light-emitting point was defined at the interface between the green-light emitting layer 4 and the electron transport layer 5 as described above.

The optical length $L_1$ corresponds to the distance between the light-emitting point and the lower reflection electrode 2. The optical length to a light emitted inside the green-light emitting layer 4 is shorter than $L_1$. When the thickness of the organic light-emitting element is controlled such that the optical length $L_1$ satisfies the equation (1), θ at which $λ_2$ of the green-light emission satisfies the equation (2) in the green-light emitting layer 4 is present. Accordingly, the light-emitting point can be defined as described above.

Further, since the organic light-emitting element of this embodiment has the light drawing-out layer 8, reflection of the green-light emission is decreased at the interface between the upper transparent electrode 7 and the light drawing-out layer 8 or at the interface between the light drawing-out layer 8 and the air layer 9. Therefore, the optimal light interference condition of the organic light-emitting element in this embodiment is different from the light interference condition to the entire layer specified in the conventional technique.

The optimal light interference condition in the organic light-emitting element in this embodiment is shown. The optical length from the light-emitting point to the lower reflection electrode 2 is a value as a product of the thickness 59 nm of the α-NPD vapor deposition film forming the hole transport layers 3 and a refractive index of 1.8 of α-NPD with addition of a value as a product of the thickness 30 nm of the green-light emitting layer and the refractive index of 1.8. Accordingly, the optical length from the light-emitting point to the reflection electrode is 160 nm. In the green-light emitting spectrum having the center wavelength of 520 nm, a wavelength at the longer wavelength side having 1% light-emitting intensity at the center wavelength is 640 nm assuming the light-emitting intensity at the center wavelength as 1. The ¼ value of the wavelength is 160 nm which is substantially equal with the optical length $L_1$. Accordingly, the light interference condition in the frontal direction of the organic light-emitting element is a constructive condition at the wavelength of 640 nm. On the other hand, the constructive light interference condition is satisfied at the center wavelength of 520 nm in the direction of the angle of 36° from the normal direction of the emitting interface of the organic light-emitting element. Further, the constructive light interference condition is satisfied at a wavelength of 480 nm at the shorter wavelength side of the green-light emitting spectrum having 1% light-emitting intensity at the center wavelength in the direction at an angle of 41° from the normal direction of the emission interface. In the organic light-emitting element of this embodiment, an emission direction that satisfies the constructive interference condition is present over the entire wavelength of the light-emitting spectrum within a range of 60° from the normal direction. Thus, the light drawing-out efficiency was improved by 1.5 times compared with an organic light-emitting element in which the light drawing-out layer is disposed in the layer configuration under the interference condition in the conventional technique. Further, since the light of the entire wavelength is emitted being averaged in the light drawing-out layer, the emission spectrum is substantially equal in each of the emission directions to suppress the view angle dependence of the light-emitting spectrum.

This embodiment discloses a layer configuration that satisfies the equation (1) and the equation (2) for the green-light emitting layer 4. A layer configuration satisfying the equation (1) and the equation (2) may be adopted also for other single color emission for a red-light emitting layer and a blue-light emitting layer, etc.

In the organic light-emitting element of this embodiment, a protective film may also be disposed between the upper transparent electrode 7 and the light drawing-out layer 8. The protective film can prevent $H_2O$ and $O_2$, which have been sealed inside by the sealing substrate 10 and the substrate 1, and a solvent upon forming the light drawing-out layer 8 from intruding into the upper transparent electrode 7 or the organic layer below the upper transparent electrode 7. Examples of materials for the protective film include specifically those having a refractive index of 1.8 or more such as $SiN_x$ and $Al_2O_3$, but materials for the protective film are not restricted to such materials.

Further, while the light drawing-out layer 8 was formed over the upper transparent electrode 7 in this embodiment, the layer may be sealed so as to be situated between the substrate 1 and the sealing substrate 10 by bonding the sealing substrate 10 and the light drawing-out layer 8 by way of an adhesive layer. In this case, it is preferred to dispose the adhesive layer so as to fill a portion between the light drawing-out layer 8 and the sealing substrate 10. In this configuration, the air layer 9 is not present between the substrate 1 and the sealing substrate 10. Damages caused by the formation of the light drawing-out layer 8 on the upper transparent electrode 7, the buffer layer 6, organic layers such as the hole transport layer 3, the green-light emitting layer 4, and the electron transport layer 5 can be decreased in a case of forming the light drawing-out layer 8 on the sealing substrate 10 compared with a case of forming the layer on the upper transparent electrode 7.

For improving the drawing-out efficiency, the refractive index of the adhesive layer is preferably larger. Then, it is suitable to form the adhesive layer by adding particles, for example, titanium oxide, zirconium oxide, and barium titanate in a transparent resin. The refractive index is increased by 0.3 or more and 0.4 or less by adding 10 wt % or more and 30 wt % or less of particles (refractive index of about 2.4 or more and 2.7 or less) compared with the case not adding the particles (refractive index is about 1.45 or more and 1.55 or less). Referring to the size of the fine particles to be added, the average particle diameter is preferably 5 nm or more and 50 nm or less. When the average particle diameter is more than 50 nm, the adhesive layer becomes cloudy. When the average particle diameter is less than 5 nm, particles tend to be scattered and handling of the particles becomes difficult since the bulk specific gravity lowers. Inorganic oxides are suitable as the particles included in the adhesive layer. This is because they are chemically stable and the color tone does not change so much even when they undergo light irradiation for long time light emission.

The adhesive layer is formed by forming a tacky resin into a film shape and then attaching the same to the sealing substrate 10. The adhesive layer is also formed by coating a monomer for forming a tacky resin to the sealing substrate 10 and, subsequently, adding a curing agent for optically or thermally promoting cure, and curing the monomer.

The monomer for the adhesive layer includes the materials shown below. Acrylic material includes methyl methacrylate, ethyl methacrylate, propyl methacrylate, isopropyl methacrylate, butylmethacrylate, isobutylmethacrylate, hexyl methacrylate, octyl methacrylate, 2-ethylhexyl methacrylate, decyl methacrylate, dodecyl methacrylate, methyl acrylate, ethyl acrylate, propyl acrylate, isopropyl acrylate, butyl acrylate, isobutyl acrylate, hexyl acrylate, octyl acrylate, 2-ethylhexyl acrylate, decyl acrylate, and dodecyl acrylate. Further, the material includes, for example, ethylene glycol, propylene glycol, diethyleneglycol, 1,3-dihydroxycyclobutane, 1,4-dihydroxy cyclohexane, and 1,5-dihydroxy cyclooctane having a plurality of hydroxyl groups in the molecule. Further, the material also includes ethylene glycol monoglycidyl ether, ethylene glycol diglycidyl ether, etc. having a glycidyl group at terminal end. Further, the material includes monomers having cyclic portions such as cycloalkane ring, aromatic ring, and norbornene ring in the side chain, monomers having bisphenol A-like skeleton, etc.

The adhesive layer is formed by using the acrylic resin alone or in plurality with other resins together. Further, the adhesive layer can be formed also by copolymerizing the same with other polymer. The polymer to be used includes polyacrylic acid, polyvinyl alcohol, and polyallyl amine. Further, shrinkage upon curing can be decreased by dissolving a polymerizate such as an acrylic resin and a urethane resin which is already polymerized and has no reaction sites with the monomer.

Embodiment 2

Figure 4:
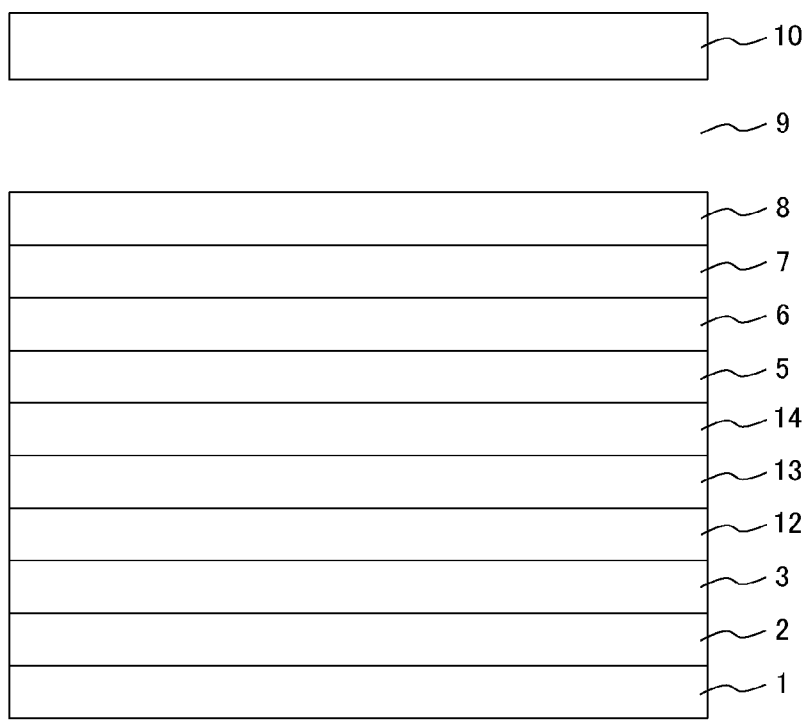
FIG. 4 is a cross sectional view of an organic light-emitting device according to another embodiment of the present invention.

Then, an organic light-emitting device according to Embodiment 2 is to be described. FIG. 4 is a cross sectional view of an organic light-emitting device according to Embodiment 2. The organic light-emitting device in this embodiment includes three light-emitting layers for performing blue-light emission, green-light emitting layer and red-light emission. In this embodiment, a light-emitting unit includes a hole transport layer 3, a blue-light emitting layer 12, a green-light emitting layer 13, a red-light emitting layer 14, an electron transport layer 5, and a buffer layer 6. However, the buffer layer 6 may be omitted as the light-emitting unit. In this embodiment, the blue-light emitting layer 12, the green-light emitting layer 13, and the red-light emitting layer 14 are arranged in this order from the lower reflection electrode 2 in the direction of drawing out light. The arrangement of the blue-light emitting layer 12, the green-light emitting layer 13, and the red-light emitting layer 14 is arbitrary. That is, they may also be arranged in the order of the blue-light emitting layer 12, the red-light emitting layer 14, and the green-light emitting layer 13 from the lower reflection electrode 2 to the direction of drawing out light. However, the thickness of the organic light-emitting element can be more decreased by arranging them in the order of the blue-light emitting layer 12, the green-light emitting layer 13, and the red-light emitting layer 14 from the lower reflection electrode 2 to the direction of drawing out light as in this embodiment.

A lower reflection electrode 2 was formed over the substrate 1. The preparation conditions were identical with those in Embodiment 1. An α-NPD co-vapor deposition film of 43 nm thickness was formed thereover as a hole transport layer 3 by using a vacuum vapor deposition method.

A co-vapor deposited film of 40 nm thickness of N,N'-dicarbazolyl-3,5-benzene (mCP) and bis-[2-(4',6'-difluorophenyl) pyridinate-N, $C^{2'}$]iridium (III) picolinate (FIrpic) was formed over the α-NPD film. The vapor deposition rate of CPB and FIrpic were 0.2 nm/sec. and 0.014 nm/sec, respectively. The co-vapor deposition film functions as a blue-light emitting layer 12. The center wavelength of the emission spectrum of the blue-light emitting layer 12 was 470 nm.

Then, a green-light emitting layer 13 of 6 nm thickness including a co-vapor deposition film of CBP and Ir(ppy)$_3$ was formed over the blue-light emitting layer 12. The manufacturing conditions were same as those in Embodiment 1.

Then, a film of 20 nm thickness formed by co-vapor deposition of CBP and bis(2-(2'-benzo[4,5-α]thienyl) pyridinate-N, $C^{3'}$)iridium(acetyl-acetnate) (btp$_2$Ir(acac))was formed over the green-light emitting layer 13. The vapor deposition rates of CBP and btp$_2$Ir(acac) were determined as 0.2 nm/sec, and 0.014 nm/sec respectively. The co-vapor deposition film functions as a red-light emitting layer 14. The center wavelength of the emission spectrum of the red-light emitting layer 14 was 610 nm.

Then, the electron transport layer 5, the buffer layer 6, the upper transparent electrode 7, and the light drawing-out layer 8 were formed over the red-light emitting layer 14. The preparation conditions were identical with those in Embodiment 1. Thus, the organic light-emitting element was completed.

Then, a substrate 1 on which the organic light-emitting element was formed and the sealing substrate 10 were sealed. The sealing conditions were the same as those in Embodiment 1. Thus, an organic light-emitting device was completed.

The light interference condition in the organic light-emitting element shown in this embodiment is shown. At first, light interference condition in the blue light emission is to be investigated. The light-emitting point of blue-light emitting layer 12 is a point in an interface between the blue-light emitting layer 12 and the green-light emitting layer 13, The optical length $L_{1R}$ from the light-emitting point to the lower reflection electrode 2 has a value of 149 nm, which is a value as a product of a film thickness of 43 nm of the α-NPD vapor deposition film forming the hole transport layer 3 and a refractive index 1.8 of α-NPD with addition of a value as a product of the film thickness 40 nm and the refractive index of 1.8 of the blue-light emitting layer 12. The center wavelengths of the blue-light emitting spectra $\lambda_{0B}$, $\lambda_{1B}$, and $\lambda_{2B}$, are 470 nm, 450 nm, 600 nm respectively. Since $L_{1R}$ is ¼ $\lambda_2$, a constructive interference condition for $\lambda_{2B}$=600 nm is provided in the normal direction. Further, a constructive interference condition for $\lambda_{0B}$ is provided in the direction slanted by 38° from the normal direction, and a constructive interference condition for $\lambda_{1B}$ is provided in the direction slanted by 41° from the normal direction, and constructive interference conditions are provided substantially in all wavelengths of the red-light emitting spectra.

Then, the light interference condition of the green-light emission is to be investigated. The light-emitting point of the green-light emitting layer 13 is a point in the interface between the green-light emitting layer 13 and the red-light emitting layer 14. The optical length $L_{1G}$ from the light-emitting point to the lower reflection electrode 2 has a value as a sum of the optical length of the hole transport layer 3, the optical length of the blue-light emitting layer 12, and the optical length of the green-light emitting layer 13. Since the green-light emitting layer 13 has a thickness of 6 nm and a refractive index of 1.8, $L_{1G}$ is 160 nm. The center wavelengths $\lambda_{0G}$, $\lambda_{1G}$, and $\lambda_{2G}$, of the green-light emitting spectra are 520 nm, 480 nm, and 640 nm respectively. Accordingly, constructive interference conditions are provided for $\lambda_{2G}$ in the direction of 36°, for $\lambda_{0G}$ in the direction of 42°, and for $\lambda_{1G}$ in the direction of 57° from the normal direction. Therefore, constructive interference conditions are provided substantially in all wavelengths of the green-light emitting spectra.

Then, the interference condition in the red-light emission is to be investigated. The light-emitting point of the red-light emitting layer 14 is a point in the interface between the red-light emitting layer 14 and the electron transport layer 5. The optical length from the light-emitting point to the lower reflection electrode 2 has a value as a sum of the optical length of the hole transport layer 3, the optical length of the blue-light emitting layer 12, the optical length of the green-light emitting layer 13, and the optical length of the red-light emitting layer 14. Since the red-light emitting layer has a thickness of 20 nm and a refractive index of 1.8, $L_{1R}$ is 196 nm. The center wavelength $\lambda_{0R}$ of the red-light emitting spectrum is 615 nm, and the wavelengths $\lambda_{1R}$, $\lambda_{2R}$ at the shorter wavelength side and the longer wavelength side where the emission intensity of the spectrum is 0.01 assuming the emission intensity at the center wavelength as 1 are 580 nm and 785 nm, respectively. A constructive interference condition for $\lambda_{2R}$=785 nm is provided in the normal direction.

Further, constructive interference conditions for $\lambda_{0R}$ in the direction of 38° and for $\lambda_{1R}$ in the direction of 42° from the normal direction are provided. Accordingly, constructive interference conditions are provided substantially in all wavelengths of the blue-light emitting spectra.

As described above, in the range of 60° from the normal direction, emitting directions of satisfying constructive interference conditions are present substantially in all wavelengths of the red-light emitting spectrum, green-light emitting spectrum, and the blue-light emitting spectrum. Thus, the light drawing-out efficiency was improved by 1.6 times compared with the case of an organic light-emitting element in which the light drawing-out layer is disposed in the layer configuration of the interference condition in the conventional technique. Further, since the light of all wavelengths is emitted while being averaged in the light drawing-out layer, the emission spectrum in each of the emission directions is substantially equal to suppress the view angle dependence of the emission spectra.

In the conventional interference condition, it is defined that the total optical length including the organic layer and the transparent electrode forming the organic light-emitting element is an integer multiple of one-half of the center emission wavelength (case 1) or that the value of the total optical length with addition of ¼ center emission wavelength is an integer multiple of one-half of the emission wavelength (case 2). If there are a plurality of light-emitting colors (red, green, and blue) as in this embodiment, it is necessary that the case 1 or case 2 is satisfied at the center wavelength of each of the emission spectra. For satisfying the case 1 for the light-emitting color of red, green, and blue in this embodiment, it is necessary to set the optical length including the organic layer (hole transport layer 3, blue-light emitting layer 12, green-light emitting layer 13, red-light emitting layer 14, and electron transport layer 5), the buffer layer 6, and the upper transparent electrode 7 to about 1.9 μm. When the optical length is converted into the total thickness, it is about 1 μm, which is large as the total thickness of the organic light-emitting element to bring about deterioration of the element performance. Further, in the case 2, the optical length is about 2.0 μm and the total thickness is about 1.1 μm, which is thick as the organic light-emitting element to deteriorate the element performance. On the other hand, according to the invention, the total thickness can be reduced to about 600 nm and deterioration of the element performance can be suppressed.

Embodiment 3

Figure 5:
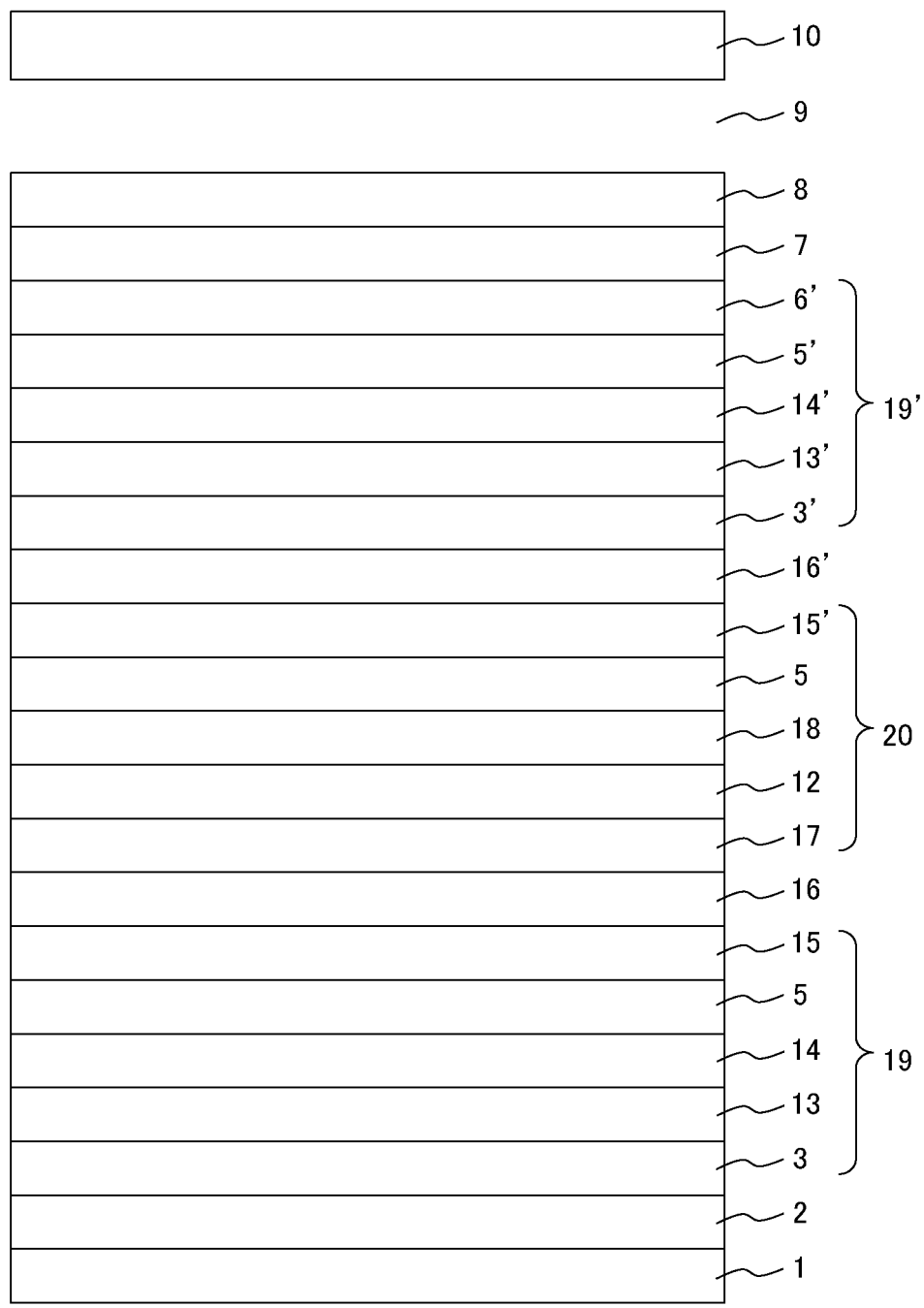
FIG. 5 is a cross sectional view of an organic light-emitting device according to another embodiment of the present invention.

Then, an organic light-emitting device according to Embodiment 3 is to be described. FIG. 5 is a cross sectional view of an organic light-emitting device according to Embodiment 3. The organic light-emitting device in this embodiment includes a white organic light-emitting element employing a multi photon emission (MPE) structure including a first red-green-light emitting unit 19, a second red-green-light emitting unit 19', and a blue-light emitting unit 20. As variations of this embodiment, it may be considered an MPE structure including a first red-blue-light emitting unit, a second red-blue-light emitting unit, and a green-light emitting unit, or an MPE structure including a first green-blue-light emitting unit, a second green-blue-light emitting unit, and a red-light emitting unit. When the three MPE structures are compared, the structure of this embodiment is most preferred. This is because blue-light emitting layer can be separated from the red-light emitting layer and the green-light emitting layer by way of a charge generating layer to improve the emission efficiency of the blue-light emitting layer. That is, by introducing the red-light emitting layer or the green-light emitting layer into the blue-light emitting layer, energy transfer occurs from the excited molecules of a dopant included in the blue-light emitting layer to the dopant included in the red-light emitting layer and the dopant included in the green-light emitting layer, so that the blue-light emitting efficiency can be increased. Further, lowering of the carrier transportability of the transporting material and the host material included in the blue-light emitting unit can be suppressed by the dopant included in the red-light emitting layer or the dopant included in the green-light emitting layer, and, as a result, emission efficiency of the blue light can be enhanced.

At first, a lower reflection electrode 2 was formed over a substrate 1. The preparation conditions were the same as those in Embodiment 1. Then, a first red-green-light emitting unit 19 was formed. An α-NPD vapor deposition film of 59 nm thickness was formed as a hole transport layer 3 over the lower reflection electrode 2 by using a vacuum vapor deposition method. Further, a green-light emitting layer 13 of 30 nm thickness, a red-light emitting layer 14 of 30 nm thickness, and an electron transport layer 5 of 10 nm thickness were formed thereover. Preparation conditions were the same as those in Embodiments 1 and 2. The refractive index of the electron transport layer 5 was 1.8. A co-vapor deposition film including $Alq_3$ and Li of 20 nm thickness was formed thereover by a vacuum vapor deposition method. The co-vapor deposition film of $Alq_3$ and Li functions as an electron injection layer 15. The refractive index of the electron injection layer 15 was 1.8. The concentration of Li was set such that the molar ratio between $Alq_3$ and Li was 1:1. As described above, the first red-green-light emitting unit 19 was formed.

Then, a vanadium pentoxide film of 10 nm thickness was formed over the first red-green-light emitting unit 19 by a vacuum vapor deposition method. The vanadium pentoxide film functions as a charge generating layer 16. The refractive index of the charge generating layer 16 was 1.8.

Then, a blue-light emitting unit 20 was formed over the charge generating layer 16. In the blue-light emitting unit, an α-NPD vapor deposition film of 80 nm thickness was firstly formed by a vacuum vapor deposition method. A blue-light emitting layer 12 of 20 nm thickness was formed thereover. A 2,9-dimethyl-4,7-diphenyl-1,10-phenanthroline (BCP) film was formed as a hole blocking layer 18 over the blue-light emitting layer 12 by a vacuum vapor deposition method. An electron transport layer 5 and an electron injection layer 15' were formed over the hole blocking layer 18. The preparation conditions were the same as those for each of the layers of the first red-green-light emitting unit 19. As described above, the blue-light emitting unit 20 was formed. A second charge generating layer 16' was formed thereover. The preparation conditions were the same as those of the charge generating layer 16.

Then, a second red-green-light emitting unit 19' was formed. An α-NPD vapor deposition film of 195 nm thickness was formed as a hole transport layer 3' over the second charge generating layer 16' by using a vacuum vapor deposition method. A green-light emitting layer 13' of 40 nm thickness, a red-light emitting layer 14' of 40 nm thickness, and an electron transport layer 5' of 10 nm thickness were formed over the hole transport layer 3'. The preparation conditions were the same as those of the first red-green-light emitting unit 19. A buffer layer 6', an upper transparent electrode 7, and a light drawing-out layer 8 were formed over the electron transport layer 5'. The preparation conditions were the same as those of Embodiment 1. Thus, an organic light-emitting element was completed.

Then, the substrate 1 on which the organic light-emitting element was formed and the sealing substrate 10 were sealed. The sealing conditions were the same as those of Embodiment 1. Thus, an organic light-emitting device was completed.

Then, a light-emitting mechanism of the MPE structure employed for the organic light-emitting element of this embodiment is to be described. The charge generating layer 16 between the first red-green-light emitting unit 19 and the blue-light emitting unit 20 supplies electrons to the electron injection layer 15 below the charge generating layer 16 and supplies holes to the hole transport layer 17 above the charge generating layer 16. The charge generating layer 16' between the blue-light emitting unit 20 and the second red-green-light emitting unit 19' supplies electrons to the electron injection layer 15' below the charge generating layer and supplies holes to the hole transport layer 3' above the charge generating layer 16'. Since an equi-potential is kept in the charge generating layer 16 and the charge generating layer 16', the amounts of the electrons and the holes supplied by the charge generating layer 16 and the charge generating layer 16' are equal if a carrier injection barrier is not present between the charge generating layer and the transport layer in contact therewith. Accordingly, in the first red-green-light emitting unit 19, holes are injected and propagated from the lower reflection electrode 2 to the hole transport layer 3, the green-light emitting layer 13, and the red-light emitting layer 14 in this order, while electrons are injected and propagated from the charge generating layer 16 to the electron injection layer 15, the electron transport layer 5, the red-light emitting layer 14, and the green-light emitting layer 13 in this order. As a result, red-green-light emission is obtained as in a usual organic light-emitting element. Further, in the blue-light emitting unit 20, holes are injected and propagated from the first charge generating layer 16 to the hole transport layer 17 and the blue-light emitting layer 12 in this order, while electrons are injected from the second charge generating layer 16' to the electron injection layer 15', blue-light emission being obtained as in a usual organic light-emitting element. Finally, in the second red-green-light emitting unit 19', holes are injected from the second charge generating layer 16' to the hole transport layer 3, the green-light emitting layer 13, and the red-light emitting layer 14 in this order, while electrons are injected from the upper transparent electrode 7 as the cathode to the buffer layer 6' and the electron transport layer 5' in this order, red-green-light emission being obtained as in the usual organic light-emitting element.

Specific examples of the material forming the charge generating layer includes, in addition to vanadium pentoxide used in the this embodiment, molybdenum oxide, tungsten oxide, vanadium oxide, aluminum oxide, ruthenium oxide, and a metal film and a transparent conductive film of 30 nm or less thickness, but they are not restrictive. Further, when a hole transport layer in which the oxide material and the hole transporting material described above are present in admixture and an electron transport layer in which the reducing material and the electron transporting material are present in admixture are used and the hole transport layer and the electron transport layer are stacked without using the charge generating layer, the hole transport layer and the electron transport layer have a function as the charge generating layer.

Then, the light interference condition in the organic light-emitting element shown in this embodiment is shown. At first, the light interference condition of red-light emission and green-light emission in the first red-green-light emitting unit 19 is to be investigated. The light-emitting point of the green light is a point in the interface between the green-light emitting layer 13 and the red-light emitting layer 14. The optical length $L_{1G}$ from the light-emitting point to the lower reflection electrode 2 is 160 nm, and constructive interference conditions are provided for $\lambda_{2G}$ in a direction slanted by 3° from the normal direction, for $\lambda_{0G}$ in the direction slanted by 36° from the normal direction, and for $\lambda_{1G}$ in the direction slanted by 42° from the normal direction, and constructive interference conditions are provided substantially in all wavelengths of the green-light emitting spectra.

Further, the light-emitting point of red light is a point in the interface between the red-light emitting layer 14 and the electron transport layer 5. The optical length $L_{1R}$ of the red-light emission is 214 nm and constructive interference conditions are provided for $\lambda_{2R}$ in the direction of 24°, for $\lambda_{0R}$ in the direction of 44°, and for $\lambda_{1R}$ in the direction of 47° from the normal direction. Accordingly, constructive interference conditions are provided substantially in all wavelengths of the red-light emitting spectra.

Then, the interference condition of the blue-light emission in the blue-light emitting unit 20 is to be investigated. The light-emitting point of the blue light is a point in the interface between the hole transport layer 17 and the blue-light emitting layer 12. Accordingly, the optical length $L_{1B}$ of the blue-light emission is 466 nm. The value is equal with ¾ $\lambda_{2B}$. Accordingly, constructive light interference conditions are provided for $\lambda_{2B}$ in the direction of 15°, for $\lambda_{0B}$, in the direction of 41°, and for $\lambda_{1B}$, in the direction of 44°. Accordingly, constructive interference conditions are provided substantially in all wavelengths of the blue-light emitting spectra.

Then, interference conditions for green-light emission and red-light emission in the second red-green-light emitting unit 19' are to be investigated. The light-emitting point of the green-light emission is a point in the interface between the green-light emitting layer 13' and the red-light emitting layer 14'. The optical length $L_{1G}$ from the light-emitting point to the lower reflection electrode 2 is 916 nm to provide constructive interference conditions for $\lambda_{2G}$ in the direction slanted by 29° from the normal direction, for $\lambda_{0G}$ in the direction slanted by 45° from the normal direction, and for $\lambda_{1G}$ in a direction slanted by 49° from the normal direction, and constructive interference conditions are provided substantially in all wavelengths of the green-light emitting spectra. Further, the optical length $L_{1R}$ of the red-light emission is 988 nm which is equal to ⅘ $\lambda_{2R}$. Accordingly, constructive light interference conditions are provided for $\lambda_{2R}$ in the direction of 7°, for $\lambda_{0R}$ in the direction of 39°, and for $\lambda_{1R}$ in the direction of 43°. Accordingly, constructive interference conditions are provided substantially in all wavelengths of the red-light emitting spectra.

In view of the above, in all of the light-emitting units, light-emitting directions satisfying constructive interference conditions are present substantially over the entire wavelength of the red-light emitting spectra, green-light emitting spectra and blue-light emitting spectra in a range from the normal direction to 60°. Thus, the light drawing-out efficiency was improved by 1.7 times compared with the organic light-emitting element in which a light drawing-out layer is disposed to the layer configuration of interference condition in the conventional technique. Further, since the light of the entire wavelengths is emitted being averaged in the light drawing-out layer, the emission spectrum is substantially equal in each of the emission directions to suppress the view angle dependence of the light-emitting spectrum.

In the conventional organic light-emitting element having a plurality of light-emitting layers including different light-emitting colors as shown in this embodiment, it was difficult to improve the external quantum efficiency for all of light-emitting layers. Accordingly, optical design was carried out to satisfy the existent light interference conditions, for example, at the wavelength of yellow, which is an intermediate wavelength of red and green, and blue. Further, in the organic light-emitting element of the MPE structure, since the entire optical length is longer compared with that of the usual light-emitting element, the wavelength region satisfying constructive interference condition necessary for improving the light drawing-out efficiency is narrowed. Accordingly, this resulted in a problem that the light drawing-out efficiency for red-light emission and blue-light emission was lowered. In view of the above, by using the MPE structure of this embodiment, the light drawing-out efficiency of the organic light-emitting element in this embodiment is increased compared with the light drawing-out efficiency of the organic light-emitting element shown in Embodiment 2.

In this embodiment, the first red-green-light emitting unit, the blue-light emitting unit, and the second red-green-light emitting unit are formed in this order from the lower reflection electrode 2. This order is not restrictive and other order may also be adopted as long as the layer configuration satisfies the equation (1) and the equation (2). For example, the order maybe the blue-light emitting unit 20, the first red-green-light emitting unit 19, and the second red-green-light emitting unit 19'. However, by forming the first red-green-light emitting unit, blue-light emitting unit, and the second red-green-light emitting unit in this order from the lower reflection electrode 2 as in this embodiment, the thickness of the organic light-emitting element can be made thinner.

| EXPLANATION OF REFERENCE CHARACTERS | |
|---|---|
| 1 | substrate |
| 2 | lower reflection electrode |
| 3 and 17 | hole transport layer |
| 4, 13 and 13' | green-light emitting layer |
| 5 and 5' | electron transport layer |
| 6 and 6' | buffer layer |
| 7 | upper transparent electrode |
| 8 | light drawing-out layer |
| 9 | air layer |
| 10 | sealing substrate |
| 12 | blue-light emitting layer |
| 14 and 14' | red-light emitting layer |
| 15 and 15' | electron injection layer |
| 16 | charge generating layer |
| 18 | hole blocking layer |
| 19 | first red-green-light emitting unit |
| 19' | second red-green-light emitting unit |
| 20 | blue-light emitting unit |

What is claimed is:

1. An organic light-emitting device comprising:
a first substrate;
a second substrate;
a light drawing-out layer disposed between the first substrate and the second substrate;
a transparent electrode disposed between the light drawing-out layer and the first substrate;
a reflection electrode disposed between the transparent electrode and the first substrate; and
a first light-emitting unit disposed between the transparent electrode and the reflection electrode;
wherein the light drawing-out layer includes particles and a binder;
wherein the particles have larger refractive index than the transparent electrode has;
wherein the first light-emitting unit includes a first light-emitting layer for emitting a first light-emitting color; and
wherein relations of equation (1) and equation (2) are satisfied:

$$L_1 \geq \lambda_2/4 \qquad (1)$$

$$L_1 \cos\theta_1 = \lambda_1(¼+n/2) \qquad (2)$$

where $L_1$ is an optical length from a first light-emitting point in the first light-emitting layer to the reflection electrode,
where $\lambda_2$ is a wavelength at the longer wavelength side, having an intensity of 1% of the maximum intensity of a light-emitting spectrum of the first light-emitting color,
where $\lambda_1$ is a wavelength at the shorter wavelength side, having an intensity of 1% of the maximum intensity of the light-emitting spectrum of the first light-emitting color,
where n is an integer not less than 0, and
where $0<\theta_1\leq 60$.

2. The organic light-emitting device according to claim 1, wherein the first light-emitting unit further includes a second light-emitting layer for emitting a second light-emitting color, and wherein relations of equation (3) and equation (4) are satisfied instead of the equation (1) and the equation (2), respectively:

$$L_2 \geq \lambda_4/4 \quad (3)$$

$$L_2 \cos\theta_2 = \lambda_3(1/4 + n/2) \quad (4)$$

where $L_2$ is a shorter optical length when comparing an optical length from the first light-emitting point in the first light-emitting layer to the reflection electrode and an optical length from a second light-emitting point in the second light-emitting layer to the reflection electrode, where $\lambda_4$ is a longer wavelength when comparing a wavelength at the longer wavelength side, having an intensity of 1% of the maximum intensity of the light-emitting spectrum of the first light-emitting color and a wavelength at the longer wavelength side, having an intensity of 1% of the maximum intensity of a light-emitting spectrum of the second light-emitting color, where $\lambda_3$ is a shorter wavelength when comparing the wavelength at the shorter wavelength side, having an intensity of 1% of the maximum intensity of the light-emitting spectrum of the first light-emitting color and the wavelength at the shorter wavelength side, having an intensity of 1% of the maximum intensity of the light-emitting spectrum of the second light-emitting color, where n is an integer not less than 0, and where $0 < \theta_2 \leq 60$.

3. The organic light-emitting device according to claim 2, wherein the first light-emitting unit further includes a third light-emitting layer for emitting a third light-emitting color, wherein a relation of equation (5) is satisfied instead of the equations (1) and (3), and wherein a relation of equation (6) is satisfied instead of the equations (2) and (4):

$$L_3 \geq \lambda_6/4 \quad (5)$$

$$L_3 \cos\theta_3 = \lambda_5(1/4 + n/2) \quad (6)$$

where $L_3$ is a shortest optical length when comparing an optical length from the first light-emitting point in the first light-emitting layer to the reflection electrode, an optical length from the second light-emitting point in the second light-emitting layer to the reflection electrode, and an optical length from a third light-emitting point in the third light-emitting layer to the reflection electrode, where $\lambda_6$ is a longest wavelength when comparing a wavelength at the longer wavelength side, having an intensity of 1% of the maximum intensity of the light-emitting spectrum of the first light-emitting color, a wavelength at the longer wavelength side, having an intensity of 1% of the maximum intensity of the light-emitting spectrum of the second light-emitting color, and a wavelength at the longer wavelength side, having an intensity of 1% of the maximum intensity of the light-emitting spectrum of the third light-emitting color, where $\lambda_5$ is a shortest wavelength when comparing a wavelength at the shorter wavelength side, having an intensity of 1% of the maximum intensity of the light-emitting spectrum of the first light-emitting color, a wavelength at the shorter wavelength side, having an intensity of 1% of the maximum intensity on the light-emitting spectrum of the second light-emitting color, and a wavelength at the shorter wavelength side, having an intensity of 1% of the maximum intensity of the light-emitting spectrum of the third light-emitting color, where n is an integer not less than 0, and where $0 < \theta_3 \leq 60$.

4. The organic light-emitting device according to claim 3, wherein the first light-emitting color is blue, the second light-emitting color is green, the third light-emitting color is red, and the first light-emitting layer, the second light-emitting layer, and the third light-emitting layer are disposed in this order from the reflection electrode to the transparent electrode.

5. The organic light-emitting device according to claim 1, further comprising:

a second light-emitting unit disposed between the transparent electrode and the reflection electrode; and a charge generating layer disposed between the first light-emitting unit and the second light-emitting unit;

wherein the second light-emitting unit includes a second light-emitting layer for emitting a second light-emitting color, and wherein relations of equation (7) and equation (8) are satisfied:

$$L_4 \geq \lambda_8/4 \quad (7)$$

$$L_4 \cos\theta_4 = \lambda_7(1/4 + n/2) \quad (8)$$

where $L_4$ is an optical length from a light-emitting point in the second light-emitting layer to the reflection electrode, where $\lambda_8$ is a wavelength at the longer wavelength side, having an intensity of 1% of the maximum intensity of a light-emitting spectrum of the second light-emitting color, where $\lambda_7$ is a wavelength at the shorter wavelength side, having an intensity of 1% of the maximum intensity of the light-emitting spectrum of the second light-emitting color, where n is an integer not less than 0, and where $0 < \theta_4 \leq 60$.

6. The organic light-emitting device according to claim 5, wherein the second light-emitting unit further includes a third light-emitting layer for emitting a third light-emitting color, and wherein relations of equation (9) and equation (10) are satisfied instead of the equation (7) and the equation (8), respectively:

$$L_{p1} \geq \lambda_{p2}/4 \quad (9)$$

$$L_{p1} \cos\theta_{p1} = \lambda_{p1}(1/4 + n/2) \quad (10)$$

where $L_{p1}$ is a shorter wavelength when comparing an optical length from the second light-emitting point in the second light-emitting layer to the reflection electrode and an optical length from a third light-emitting point in the third light-emitting layer to the reflection electrode, where $\lambda_{p2}$ is a longer wavelength when comparing a wavelength at the longer wavelength side, having an intensity of 1% of the maximum intensity of the light-emitting spectrum of the second light-emitting color and a wavelength at the longer wavelength side, having an intensity of 1% of the maximum intensity of the light-emitting spectrum of the third light-emitting color, where $\lambda_{p1}$ is a shorter wavelength when comparing a wavelength at the shorter wavelength side, having an intensity of 1% of the maximum intensity of the light-emitting spectrum of the second light-emitting color and a wavelength at the shorter wavelength side, having an intensity of 1% of the maximum intensity of the light-emitting spectrum of the third light-emitting color, where n is an integer not less than 0, and where $0<\theta_{p1}\leq 60$.

7. The organic light-emitting device according to claim 6, wherein the first light-emitting color is blue, and one of the second light-emitting color and the third light-emitting color is red and the other of them is green.

8. The organic light-emitting device according to claim 1, wherein the first light-emitting unit includes a second light-emitting layer for emitting a second light-emitting color, and wherein relations of equation (11) and equation (12) are satisfied:

$$L_5 \geq \lambda_{10}/4 \quad (11)$$

$$L_5 \cos\theta_1 = \lambda_9(\tfrac{1}{4}+n/2) \quad (12)$$

where $L_5$ is an optical length from the second light-emitting point in the second light-emitting layer to the reflection electrode, where $\lambda_{10}$ is a wavelength at the longer wavelength side, having an intensity of 1% of the maximum intensity of the light-emitting spectrum of the second light-emitting color, where $\lambda_9$ is a wavelength at the shorter wavelength side, having an intensity of 1% of the maximum intensity of the light-emitting spectrum of the second light-emitting color, where n is an integer not less than 0, and where $0<\theta_5\leq 60$.

9. The organic light-emitting device according to claim 1, wherein the light drawing-out layer is bonded to the second substrate by an adhesive layer.

10. The organic light-emitting device according to claim 1, wherein the first light-emitting unit further includes a hole transport layer, an electron transport layer, a buffer layer, a hole injection layer, and an electron injection layer.

11. A light source apparatus, comprising:

the organic light-emitting device according to claim 1; and a driving device.

* * * * *